US010720302B2

(12) United States Patent
Morishita et al.

(10) Patent No.: US 10,720,302 B2
(45) Date of Patent: Jul. 21, 2020

(54) ELECTRON MICROSCOPE

(71) Applicant: JEOL Ltd., Tokyo (JP)

(72) Inventors: Shigeyuki Morishita, Tokyo (JP); Takeo Sasaki, Tokyo (JP); Tomohiro Nakamichi, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 16/289,872

(22) Filed: Mar. 1, 2019

(65) Prior Publication Data
US 2019/0272971 A1    Sep. 5, 2019

(30) Foreign Application Priority Data

Mar. 5, 2018    (JP) .................................. 2018-038371

(51) Int. Cl.
*H01J 37/26*    (2006.01)
*H01J 37/153*    (2006.01)
*H01J 37/22*    (2006.01)

(52) U.S. Cl.
CPC .......... *H01J 37/153* (2013.01); *H01J 37/222* (2013.01); *H01J 37/265* (2013.01); *H01J 2237/1534* (2013.01); *H01J 2237/221* (2013.01); *H01J 2237/2802* (2013.01); *H01J 2237/282* (2013.01)

(58) Field of Classification Search
CPC ....... H01J 2237/1534; H01J 2237/2902; H01J 2237/282; H01J 37/153; H01J 37/265; H01J 37/28; H01J 37/26
See application file for complete search history.

(56) References Cited

U.S. PATENT DOCUMENTS

| 5,300,776 A | * | 4/1994 | Krivanek ................ H01J 37/21 250/307 |
| 7,060,986 B2 | * | 6/2006 | Nakamura ............ H01J 37/153 250/310 |
| 9,123,501 B2 | * | 9/2015 | Fukuda .................. H01J 37/153 |
| 9,865,427 B2 | * | 1/2018 | Bierhoff .................. H01J 37/16 |
| 2009/0020699 A1 | * | 1/2009 | Sasajima ............ G03F 7/70608 250/310 |

(Continued)

FOREIGN PATENT DOCUMENTS

JP    2015215970 A    12/2015

OTHER PUBLICATIONS

Sawada, H., et al. "Higher-order aberration corrector for an image-forming system in a transmission electron microscope." Ultramicroscopy 110.8 (2010): 958-961 (Year: 2010).*

(Continued)

*Primary Examiner* — Wyatt A Stoffa
(74) *Attorney, Agent, or Firm* — The Webb Law Firm

(57) ABSTRACT

An electron microscope includes: an optical system including an aberration correction device; and a control unit that controls the aberration correction device, wherein the control unit performs: processing for displaying, on a display unit, an image for designating a direction of aberration in superposition on an aberration pattern representing a state of aberration, processing for specifying the direction of aberration from the image that has been subjected to a rotation operation, and processing for controlling the aberration correction device to cause the aberration correction device to introduce an aberration in the specified direction.

4 Claims, 8 Drawing Sheets

(56) References Cited

U.S. PATENT DOCUMENTS

| | | | | |
|---|---|---|---|---|
| 2013/0099117 A1* | 4/2013 | Akima | ............... | H01J 37/261 |
| | | | | 250/311 |
| 2013/0256531 A1* | 10/2013 | Yoshida | ............... | H01J 37/28 |
| | | | | 250/307 |
| 2014/0231666 A1* | 8/2014 | Akima | ............... | H01J 37/153 |
| | | | | 250/396 R |
| 2015/0060654 A1* | 3/2015 | Urano | ............... | G01Q 40/00 |
| | | | | 250/252.1 |
| 2015/0235801 A1* | 8/2015 | Akima | ............... | H01J 37/28 |
| | | | | 250/307 |
| 2016/0020066 A1* | 1/2016 | Morishita | ............ | H01J 37/222 |
| | | | | 702/151 |
| 2016/0041064 A1* | 2/2016 | Morishita | ......... | G01M 11/0257 |
| | | | | 702/189 |
| 2017/0365442 A1* | 12/2017 | Morishita | ............... | H01J 37/28 |
| 2018/0366295 A1* | 12/2018 | Morishita | ............ | H01J 37/226 |
| 2019/0214222 A1* | 7/2019 | Urano | ............... | H01J 37/153 |
| 2019/0228949 A1* | 7/2019 | Janssen | ............... | G06T 9/005 |

OTHER PUBLICATIONS

Sawada, Hidetaka, et al. "Correction of higher order geometrical aberration by triple 3-fold astigmatism field." Journal of Electron Microscopy 58.6 (2009): 341-347 (Year: 2009).*

* cited by examiner

ELECTRON MICROSCOPE

CROSS-REFERENCE TO RELATED APPLICATION

This application claims priority to Japanese Patent Application No. 2018-038371 filed Mar. 5, 2018, the disclosure of which is hereby incorporated by reference in its entirety.

BACKGROUND OF THE INVENTION

Field of the Invention

The present invention relates to an electron microscope.

Description of Related Art

In a transmission electron microscope (TEM) or a scanning transmission electron microscope (STEM), aberration correction is an important technique for acquiring a high-resolution image.

The procedure of aberration correction in the transmission electron microscope is complicated. Therefore, in recent years, automation of aberration correction has been advanced. A technique for such automation of aberration correction is disclosed, for example, in JP-A-2015-215970.

In aberration correction, the accuracy of aberration measurement becomes important. Conventionally, various aberration measurement methods have been suggested, but there are cases where aberration cannot be correctly measured, for example, when the aberration is small. For this reason, even when the user can recognize the aberration, where aberration correction is automated, it is impossible to correct the aberration. Further, in some cases, in order to cancel an arbitrary aberration, it is desirable to intentionally introduce another aberration. Thus, in some cases, the user may want to introduce an arbitrary aberration when performing aberration correction.

In order for the user to introduce an aberration, it is necessary to designate the direction of the aberration, but in the conventional electron microscope, the operability of the operation for designating the direction of aberration is poor.

SUMMARY OF THE INVENTION

The invention can provide an electron microscope with good operability.

According to one aspect of the invention, there is provided an electron microscope including:

an optical system including an aberration correction device; and a control unit that controls the aberration correction device, the control unit performing:

processing for displaying, on a display unit, an image for designating a direction of aberration in superposition on an aberration pattern representing a state of aberration;

processing for specifying the direction of aberration from the image that has been subjected to a rotation operation; and processing for controlling the aberration correction device to cause the aberration correction device to introduce an aberration in the specified direction.

DESCRIPTION OF THE INVENTION

According to one embodiment of the invention, there is provided an electron microscope including:

an optical system including an aberration correction device; and a control unit that controls the aberration correction device, the control unit performing:

processing for displaying, on a display unit, an image for designating a direction of aberration in superposition on an aberration pattern representing a state of aberration;

processing for specifying the direction of aberration from the image that has been subjected to a rotation operation; and processing for controlling the aberration correction device to cause the aberration correction device to introduce an aberration in the specified direction.

In such an electron microscope, since the direction of aberration is specified from the image having been subjected to the rotation operation and the aberration correction device is controlled so as to introduce aberration in the specified direction, the user can designate the direction of aberration by rotating the image. Therefore, with such an electron microscope, the direction of aberration can be intuitively designated and the operability is good.

Embodiments of the invention are described in detail below with reference to the drawings. Note that the following embodiments do not unduly limit the scope of the invention as stated in the claims. In addition, all of the elements described in connection with the following embodiments should not necessarily be taken as essential requirements of the invention.

1. First Embodiment

1.1. Configuration of Electron Microscope

Figure 1:
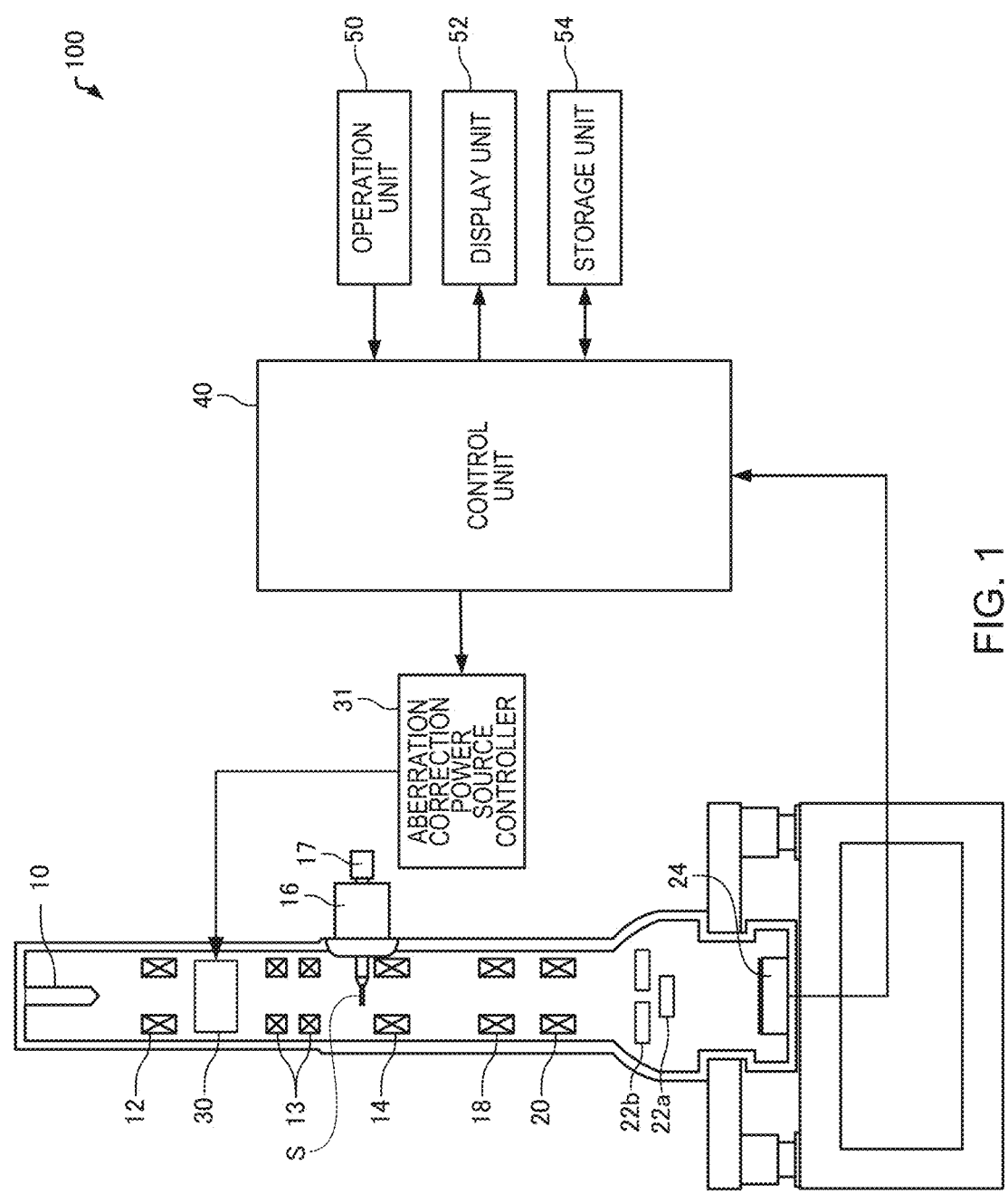
FIG. 1 illustrates a configuration of an electron microscope according to a first embodiment.

First, the electron microscope according to the first embodiment will be described with reference to the drawings. FIG. 1 illustrates the configuration of an electron microscope 100 according to the first embodiment.

The electron microscope 100 is a scanning transmission electron microscope (STEM) equipped with an optical system including an aberration correction device 30. In the scanning transmission electron microscope, a scanning transmission electron microscope image (STEM image) can be obtained by scanning a sample S with an electron probe (focused electron beam) and detecting electrons transmitted through the sample S.

As illustrated in FIG. 1, the electron microscope 100 includes an electron source 10, an optical system (a condenser lens 12, a scanning coil 13, an objective lens 14, an intermediate lens 18, a projection lens 20, an aberration correction device 30), a sample stage 16, a sample holder 17, STEM detectors 22a and 22b, an image capturing device 24, a control unit 40, an operation unit 50, a display unit 52, and a storage unit 54.

The electron source 10 generates electrons. The electron source 10 is, for example, an electron gun that accelerates electrons emitted from a cathode with an anode and emits an electron beam.

The condenser lens 12 focuses the electron beam emitted from the electron source 10. Although not shown, the condenser lens 12 may be configured of a plurality of electronic lenses. The condenser lens 12 and the objective lens 14 constitute an irradiation system of the electron microscope 100.

The scanning coil 13 is a coil for deflecting the electron beam and scanning the sample S with an electron beam (electron probe) focused by the condenser lens 12 and the objective lens 14. The scanning coil 13 deflects the electron probe based on a scanning signal generated by a control device (not shown) of the electron microscope 100. As a result, it is possible to scan the sample S with the electron probe.

The objective lens 14 is a lens for focusing the electron beam onto the sample S to form the electron probe. Further, the objective lens 14 forms an image with electrons transmitted through the sample S.

The sample stage 16 supports the sample S held by the sample holder 17. The sample S can be positioned by the sample stage 16.

The intermediate lens 18 and the projection lens 20 guide the electrons transmitted through the sample S to the STEM detectors 22a and 22b. The intermediate lens 18 and the projection lens 20 further enlarge the image formed by the objective lens 14 and form an image on the image capturing device 24. The objective lens 14, the intermediate lens 18, and the projection lens 20 constitute an image-forming system of the electron microscope 100.

The bright-field STEM detector 22a detects electrons transmitted without being scattered and electrons scattered at a predetermined angle or less among electrons transmitted through the sample S. The bright-field STEM detector 22a is arranged on the optical axis, but this detector can be withdrawn from the optical axis when the image capturing device 24 is used. The dark-field STEM detector 22b detects electrons scattered at a specific angle by the sample S. The dark-field STEM detector 22b is an annular detector.

The image capturing device 24 captures the image formed by the image-forming system. The image capturing device 24 is, for example, a digital camera such as a charge coupled device (CCD) camera.

The aberration correction device 30 is incorporated in the irradiation system of the electron microscope 100. In the illustrated example, the aberration correction device 30 is arranged at a stage behind the condenser lens 12. The aberration correction device 30 corrects the aberration of the irradiation system of the electron microscope 100. Specifically, the aberration correction device 30 is a spherical aberration correction device that corrects a spherical aberration of the irradiation system by generating a negative spherical aberration and canceling a positive spherical aberration of the irradiation system.

In the electron microscope 100, the electron beam emitted from the electron source 10 is focused by the condenser lens 12 and the objective lens 14 to form an electron probe which is radiated onto the sample S. At this time, the aberration of the electron beam radiated onto the sample S is corrected by the aberration correction device 30. The electron beam radiated onto the sample S is scanned on the sample S by the scanning coil 13. The electron beam transmitted through the sample S is guided to the STEM detectors 22a and 22b by the objective lens 14, the intermediate lens 18 and the projection lens 20, and detected by the STEM detectors 22a and 22b. The STEM detectors 22a and 22b send intensity signals (detection signals) of the detected electrons to a signal processing unit (not shown). The signal processing unit synchronizes the intensity signals (detection signals) of the electrons detected by the STEM detectors 22a and 22b with a scanning signal to form images and generates a bright-field STEM image and a dark-field STEM image.

Further, in the electron microscope 100, the image capturing device 24 can acquire a projection image (Ronchigram) of the sample that appears on the diffraction surface by focusing the electron beam near the sample S with the irradiation system. Information on the projection image (Ronchigram) acquired by the image capturing device 24 is sent to the control unit 40.

Figure 2:
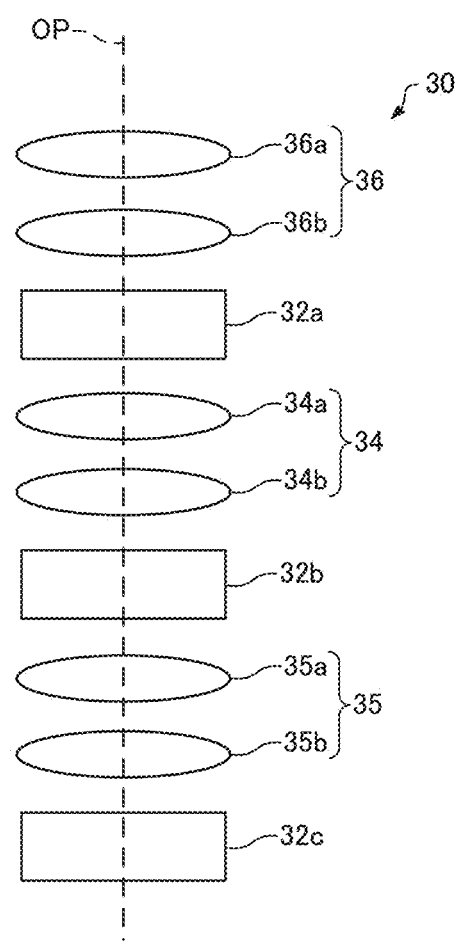
FIG. 2 schematically illustrates an aberration correction device.

FIG. 2 schematically illustrates the aberration correction device 30. The aberration correction device 30 has three stages of multipole elements 32a, 32b, and 32c. That is, the aberration correction device 30 is a three-stage three-fold-field type spherical aberration correction device.

The aberration correction device 30 is configured to include three stages of multipole elements (first multipole element 32a, second multipole element 32b, and third multipole element 32c), a first transfer lens system 34, and a second transfer lens system 35.

The first multipole element 32a generates a three-fold symmetric field. The three-fold symmetric field is a field where the field strength has three symmetries. The three-fold symmetric field generated by the first multipole element 32a is a three-fold symmetric electric field, a three-fold symmetric magnetic field, or a three-fold symmetric electromagnetic field. The first multipole element 32a is, for example, a twelve-pole element. The first multipole element 32a is not limited to a twelve-pole element as long as a three-fold symmetric field can be generated.

The first multipole element 32a has a thickness along the optical axis OP. Here, in a multipole having a thickness, aberration different from the aberration occurring in a thin multipole element appears as a combination aberration. For multipole elements that generate a three-fold symmetric field, negative spherical aberration occurs as a combination aberration. In the aberration correction device 30, this negative spherical aberration is used to correct the positive spherical aberration of the irradiation system.

The configurations of the second multipole element 32b and the third multipole element 32c are the same as that of the first multipole element 32a. That is, each of the second multipole element 32b and the third multipole element 32c generates a three-fold symmetric field. In addition, the second multipole element 32b and the third multipole element 32c each have a thickness along the optical axis OP.

The first transfer lens system 34 is disposed between the first multipole element 32a and the second multipole element 32b. The first transfer lens system 34 is configured of a pair of transfer lenses (a first transfer lens 34a and a second transfer lens 34b). A second transfer lens system 35 is disposed between the second multipole element 32b and the third multipole element 32c. The second transfer lens system 35 is configured of a pair of transfer lenses (a first transfer lens 35a and a second transfer lens 35b).

A transfer lens system 36 is disposed between the condenser lens 12 and the first multipole element 32a. The transfer lens system 36 includes a pair of transfer lenses (a first transfer lens 36a and a second transfer lens 36b).

In the above description, the case is explained in which the aberration correction device 30 is a three-stage three-fold-field type spherical aberration correction device, but the aberration correction device 30 is not limited to the three-stage three-fold-field type spherical aberration correction device, and various types of aberration correction devices can be used.

The operation unit 50 acquires an operation signal corresponding to the operation by the user and performs processing of sending the operation signal to the control unit 40. The function of the operation unit 50 can be realized by, for example, a button, a key, a touch panel type display, a microphone or the like. By using the operation unit 50, it is possible to rotate an indicator 4 which will be described hereinbelow.

The display unit 52 displays the image generated by the control unit 40, and the function thereof can be realized by a display such as a liquid crystal display (LCD). On the display unit 52, a below-described graphical user interface (GUI) for controlling the aberration correction device 30 is displayed.

The storage unit 54 stores programs, data, and the like for the control unit 40 to perform various calculation processing and control processing. The storage unit 54 is also used as a work area of the control unit 40 and is also used for temporarily storing calculation results and the like executed by the control unit 40 according to various programs. The function of the storage unit 54 can be realized by a hard disk, a random access memory (RAM), or the like.

The control unit 40 performs processing for controlling the aberration correction device. The processing of the control unit 40 will be described hereinbelow. The function of the control unit 40 can be realized by executing a program by various processors (central processing unit (CPU) etc.).

1.2. Operation

Next, the operation of the electron microscope 100 when a user introduces a desired aberration will be described.

Figure 3:
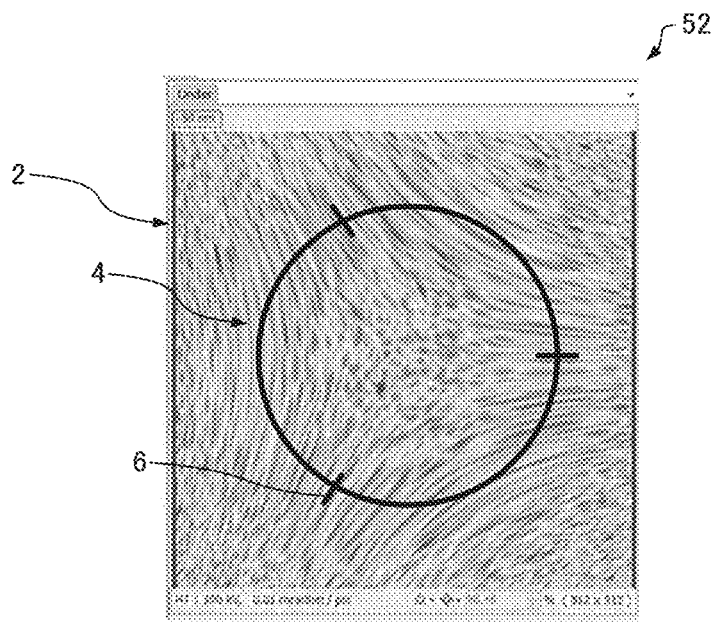
FIG. 3 illustrates a GUI for operating the aberration correction device.
Figure 4:
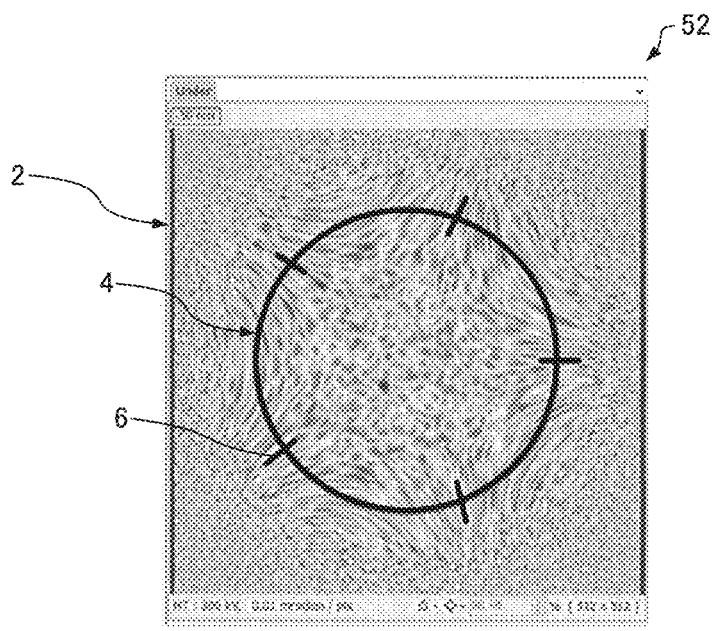
FIG. 4 illustrates a GUI for operating the aberration correction device.

FIGS. 3 and 4 illustrate a GUI for controlling the aberration correction device 30.

On the display unit 52, an indicator 4 for designating the direction of aberration is displayed in superposition on an aberration pattern 2 showing the state of aberration.

In the illustrated example, the aberration pattern 2 is a Ronchigram representing the state of aberration of the irradiation system. The aberration pattern 2 may be a previously acquired Ronchigram. The Ronchigram may be also constantly captured by the image capturing device 24, and the Ronchigram may be displayed on the display unit 52 in real time.

The aberration pattern 2 is not limited to the Ronchigram as long as it is an image representing the state of aberration.

For example, a probe tableau method is known as a STEM aberration measurement method. With the probe tableau method, a plurality of STEM images is captured by changing the angle of electron beam irradiation on the sample surface, and aberration is measured based on a probe image obtained by deconvolution of the captured images. This probe image may be used as the aberration pattern 2.

Further, for example, a phase map indicating the state of aberration may be used as the aberration pattern 2.

The indicator 4 is an image for designating the direction of aberration. The indicator 4 has a shape corresponding to the type of aberration to be introduced. For example, the indicator 4 may be displayed as an image having symmetry corresponding to the symmetry of the aberration. When the type of aberration to be introduced is changed, the shape of the indicator 4 is also changed.

For example, when the aberration to be introduced has three-fold symmetry, as illustrated in FIG. 3, the indicator 4 is an image having three markers 6, the markers 6 being arranged on a circle at 120° intervals. As a result, it is possible to easily grasp the direction of aberration having three-fold symmetry, and intuitively designate the direction of aberration.

Further, for example, when the aberration to be introduced has five-fold symmetry, as illustrated in FIG. 4, the indicator 4 is an image having five markers 6, the markers 6 being arranged on a circle at 72° intervals. As a result, it is possible to easily grasp the direction of aberration having five-fold symmetry, and intuitively designate the direction of aberration.

Figure 5:
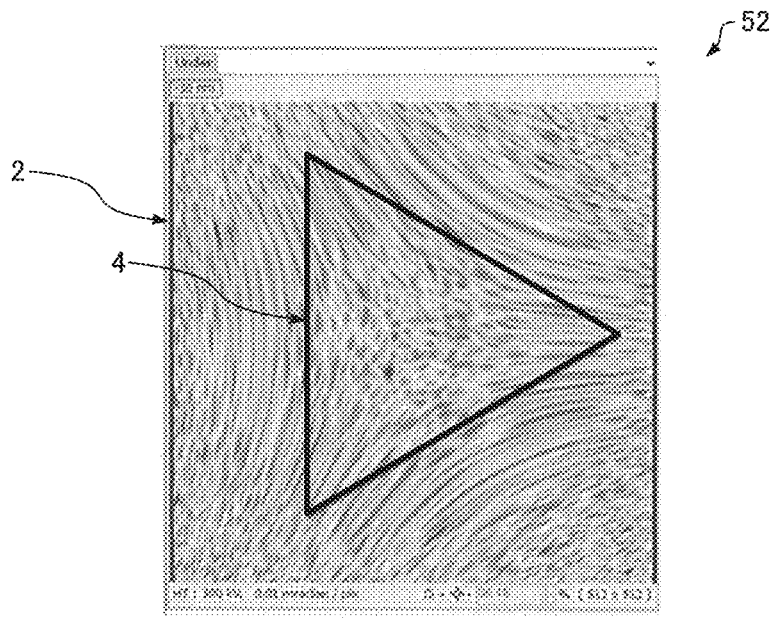
FIG. 5 illustrates a modified example of an indicator.
Figure 6:
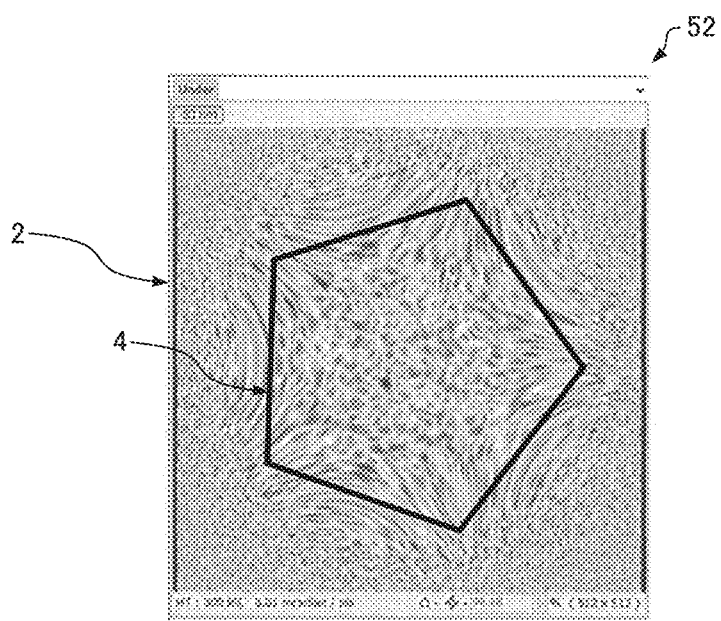
FIG. 6 illustrates a modified example of an indicator.

The shape of the indicator 4 is not particularly limited as long as the shape corresponds to the type of aberration. FIG. 5 and FIG. 6 illustrate modified examples of the indicator 4.

For example, when the aberration to be introduced has three-fold symmetry, as illustrated in FIG. 5, the indicator 4 may be an equilateral triangle. As a result, it is possible to easily grasp the direction of aberration having three-fold symmetry, and intuitively designate the direction of aberration.

Further, for example, when the aberration to be introduced has five-fold symmetry, as illustrated in FIG. 6, the indicator 4 may be a regular pentagon. As a result, it is possible to easily grasp the direction of aberration having five-fold symmetry, and intuitively designate the direction of aberration.

Figure 7:
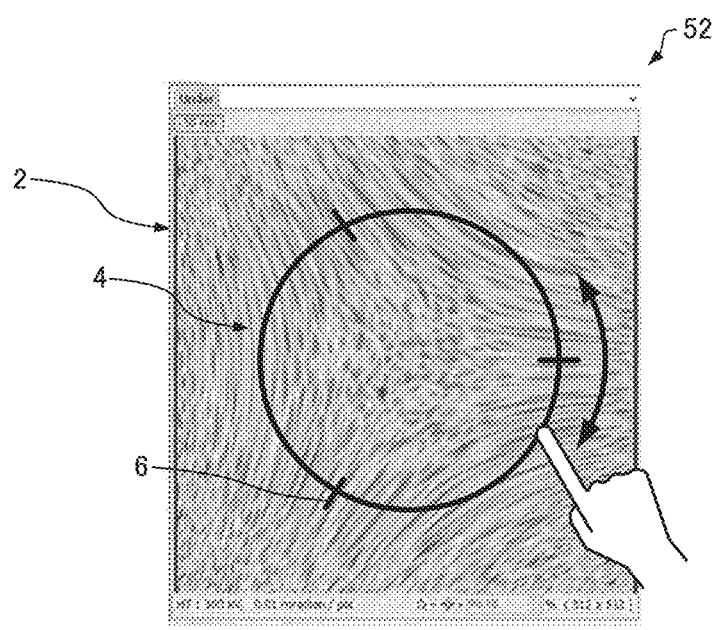
FIG. 7 is a diagram for describing the operation of the indicator.

Next, a method for designating the direction of aberration using the indicator 4 will be described. FIG. 7 is a diagram for describing the operation of the indicator 4.

The indicator 4 can be rotated using a pointing device such as a mouse (an example of the operation unit 50). Further, when the display unit 52 is a touch panel type display, the indicator 4 can be rotated by sliding a hand, a pen, or the like while touching the indicator 4 displayed on the display unit 52. By the rotation operation of the indicator 4, it is possible to designate the direction of aberration. The direction indicated by the indicator 4 after the rotation operation of the indicator 4 is the direction of the introduced aberration.

Next, a method of setting the magnitude of the aberration will be described.

By contrast with the direction of the aberration, the magnitude of the aberration is easy to understand by expressing it numerically. Therefore, the magnitude of the aberration is designated numerically. Instead of inputting numerical values, the magnitude of the aberration may be designated by wheel operation of a mouse or the like. Further, the magnitude of the aberration can be set in both the positive direction and the negative direction. Therefore, it is possible to intentionally introduce an aberration, and it is also possible to correct an aberration.

1.3. Processing by Control Unit

Next, the processing of the control unit 40 will be described.

Figure 8:
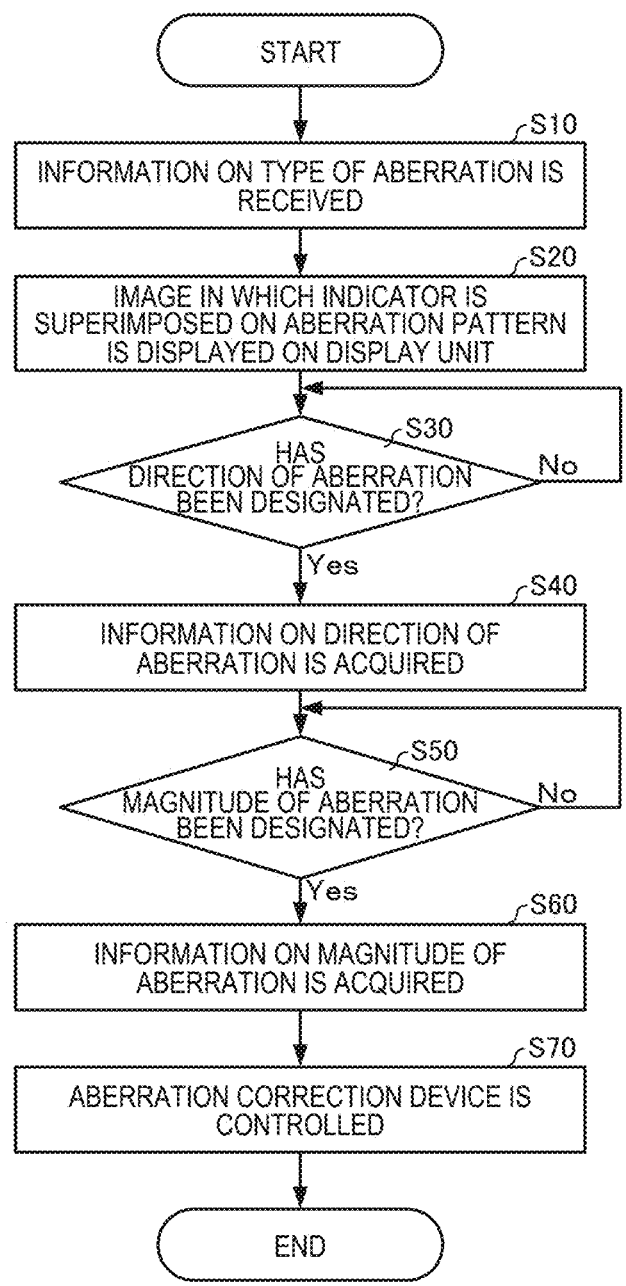
FIG. 8 is a flowchart illustrating an example of processing by the control unit.

FIG. 8 is a flowchart illustrating an example of processing of the control unit 40.

In the electron microscope 100, a Ronchigram as an aberration pattern 2 showing the state of the aberration of the irradiation system is captured in advance, stored in the storage unit 54 and displayed on the display unit 52.

First, the control unit 40 receives information on the type of aberration to be introduced (S10).

For example, when the user operates the operation unit 50 to input information on the type of aberration to be introduced, the control unit 40 receives the operation signal and acquires information on the type of aberration to be introduced.

Upon receiving the information on the type of aberration, the control unit 40 displays the indicator 4 on the display unit 52 in superposition on the aberration pattern 2 (Ronchigram) (S20). At this time, the control unit 40 causes the display unit 52 to display the indicator 4 having a shape corresponding to the type of aberration to be introduced, based on information on the type of aberration to be introduced.

Next, the control unit 40 performs the processing of determining whether or not the direction of the aberration has been designated (S30).

When the user has rotated the indicator 4 displayed on the display unit 52 to designate the direction of the indicator 4, it is determined that the direction of the aberration has been designated.

Where it is determined that the direction of the aberration has been designated (Yes in S30), the control unit 40 specifies the direction of the aberration from the indicator 4 having been subjected to the rotation operation and acquires the information of the direction of the aberration to be introduced (S40).

The control unit 40 performs the processing of determining whether or not the magnitude of the aberration has been designated (S50).

When the user has inputted the magnitude of the aberration via the operation unit 50, it is determined that the magnitude of the aberration has been designated.

Where it is determined that the magnitude of the aberration has been designated (Yes in S50), the control unit 40 acquires information on the magnitude of the inputted aberration (S60).

The control unit 40 controls the aberration correction device 30 so that the designated type of aberration is introduced with the designated direction and magnitude, based on the acquired aberration direction information and aberration magnitude information (S70).

The control unit 40 generates a control signal based on the acquired aberration type information, aberration direction information, and aberration magnitude information, and sends the control signal to the aberration correction power source controller 31. As a result, the aberration correction device 30 operates, and the designated type of aberration is introduced with the designated direction and magnitude.

By the above processing, the desired aberration can be introduced.

1.4. Features

The electron microscope 100 has, for example, the following features.

The electron microscope 100 includes the optical system including the aberration correction device 30, and the control unit 40 that controls the aberration correction device 30, the control unit 40 performing: processing for displaying, on the display unit 52, an indicator 4 for designating the direction of aberration in superposition on the aberration pattern 2 representing the state of aberration, processing for specifying the direction of aberration from the indicator 4 having been subjected to a rotation operation, and processing for controlling the aberration correction device 30 to cause the aberration correction device to introduce the aberration in the specified direction. Therefore, in the electron microscope 100, it is possible to intuitively perform the operation of designating the direction of the aberration to be introduced, and the operability is good.

In the electron microscope 100, the control unit 40 performs processing of receiving information on the type of aberration to be introduced, and in the processing of displaying the indicator 4 on the display unit 52, the indicator 4 having the shape corresponding to the type of aberration is displayed on the display unit 52 based on the information of the type of aberration. Therefore, with the electron microscope 100, it is possible to intuitively perform the operation of designating the direction of the aberration to be introduced, and the operability is good.

2. Second Embodiment

Figure 9:
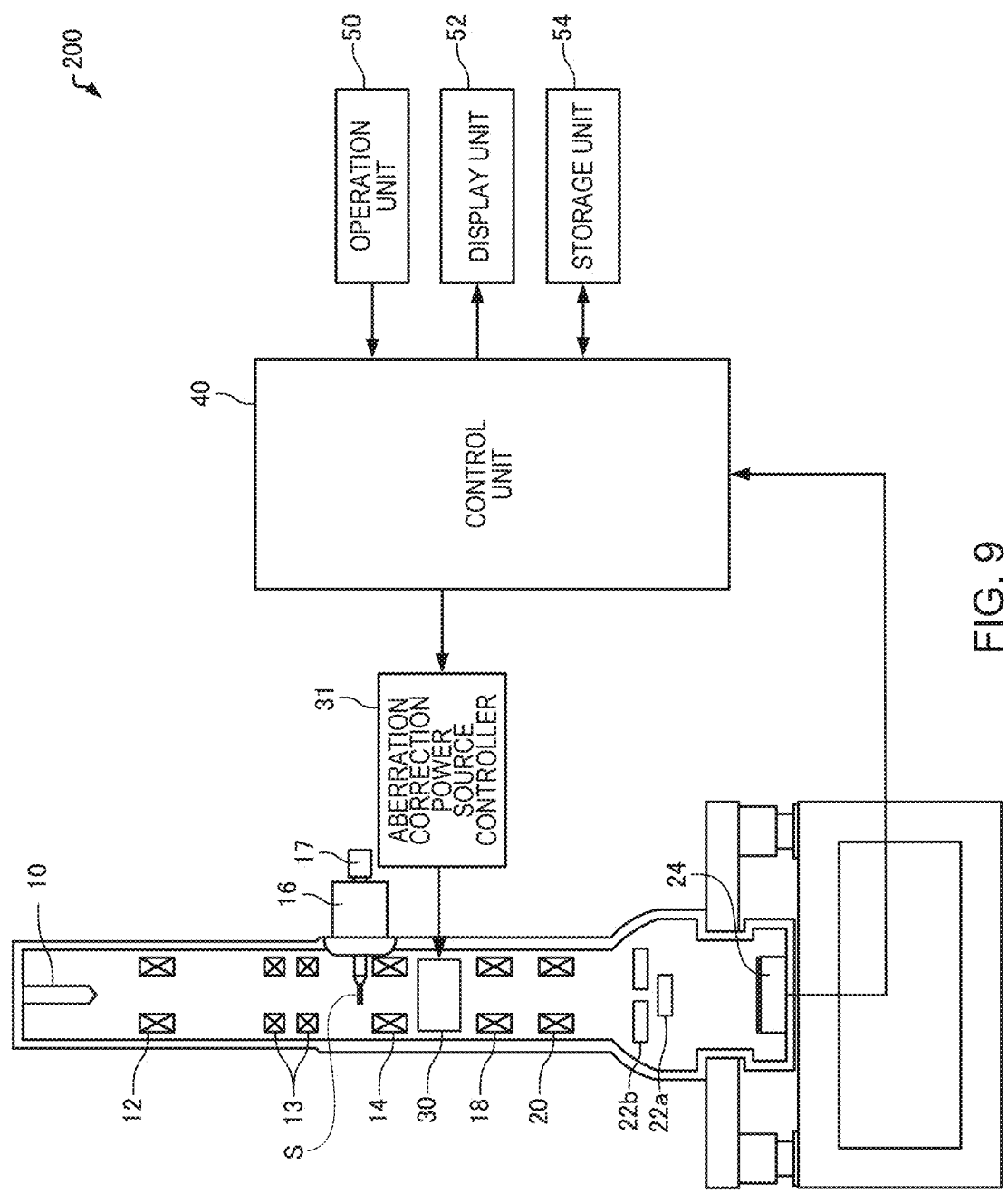
FIG. 9 illustrates a configuration of an electron microscope according to a second embodiment.

Next, an electron microscope according to the second embodiment will be described with reference to the drawings. FIG. 9 is a diagram illustrating the configuration of an electron microscope 200 according to the second embodiment. In the electron microscope 200 according to the second embodiment, members having functions similar to those of the members constituting the electron microscope 100 according to the first embodiment are denoted by the same reference numerals, and a detailed description thereof will be omitted.

In the electron microscope 100 described above, as illustrated in FIG. 1, the aberration correction device 30 is incorporated in the irradiation system.

Meanwhile, in the electron microscope 200, as illustrated in FIG. 9, the aberration correction device 30 is incorporated in the image capturing system. The aberration correction device 30 corrects the aberration of the imaging system.

In the electron microscope 200, the electron beam emitted from the electron source 10 is focused by the condenser lens 12 and irradiated onto the sample S. The image of the electron beam transmitted through the sample S is formed by the objective lens 14, the intermediate lens 18 and the projection lens 20. The formed transmission electron microscope image (TEM image) is captured by the image capturing device 24. In the electron microscope 200, since the aberration of the image-forming system can be corrected by the aberration correction device 30, a TEM image of high resolution can be obtained.

When the aberration correction device 30 is incorporated in the image-forming system, for example, a diffractogram tableau can be used as the aberration pattern 2.

Figure 10:
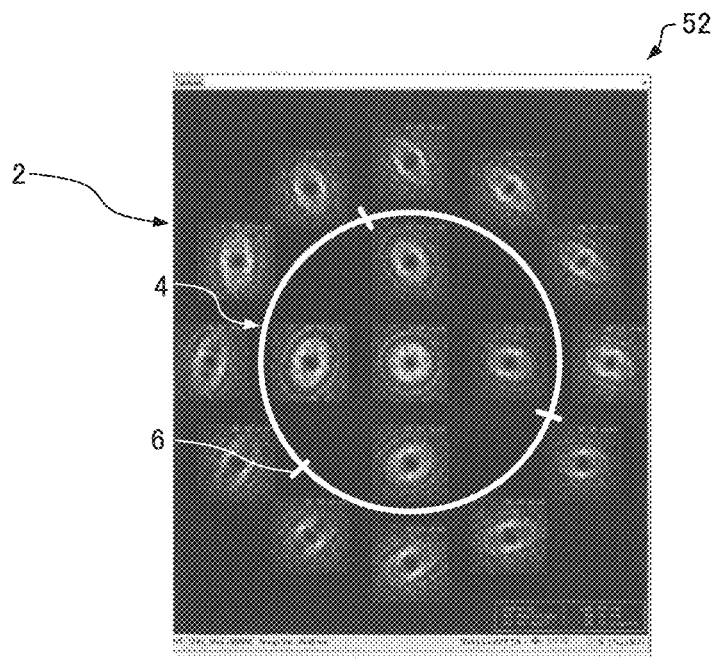
FIG. 10 illustrates a GUI for operating the aberration correction device.

FIG. 10 illustrates a GUI for operating the aberration correction device 30.

On the display unit 52, an indicator 4 for designating the direction of aberration is displayed on the diffractogram tableau serving as the aberration pattern 2 showing the state of aberration. The aberration pattern 2 is not limited to the diffractogram tableau as long as it is an image representing the state of aberration of the image-forming system.

In the electron microscope 200, similarly to the electron microscope 100, it is possible to intuitively perform the operation of designating the direction of the aberration to be introduced, and the operability is good.

3. Other

It should be noted that the invention is not limited to the above-described embodiments, and various modifications can be made within the scope of the invention.

Figure 11:
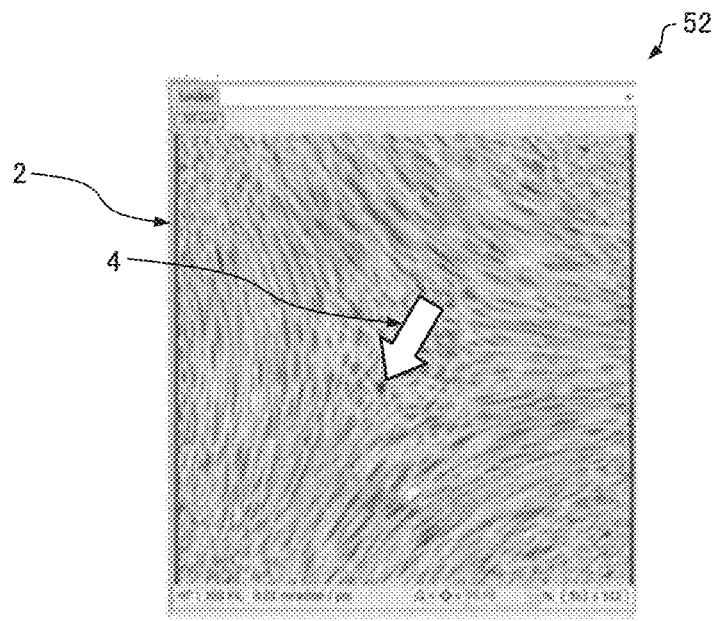
FIG. 11 illustrates a GUI for operating the aberration correction device.

For example, in the embodiments described above, the indicator 4 has a shape corresponding to the type of aberration, but the shape of the indicator 4 is not limited as long as the direction of the aberration can be designated. For example, as illustrated in FIG. 11, the indicator 4 may be an arrow. The direction of the aberration can be designated by the arrow as the indicator 4. Even with such an indicator 4, an operation of designating the direction of the aberration to be introduced can be intuitively performed.

The above-described embodiments and modifications are exemplary, and the invention is not limited thereto. For example, the embodiments and modifications can be appropriately combined.

The invention includes configurations that are substantially the same (for example, in function, method, and results, or in objective and effects) as the configurations described in the embodiments. The invention also includes configurations in which non-essential elements described in the embodiments are replaced by other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

The invention claimed is:

1. An electron microscope comprising:
   an optical system including an aberration correction device; and
   a control unit that controls the aberration correction device,
   the control unit to:
     cause a display unit to display an aberration pattern representing a state of aberration and an indicator in superposition on the aberration pattern, wherein the indicator is an image for designating a direction of aberration;
     receive an input associated with a rotation operation to be performed on the indicator, the indicator designating the direction of aberration based on the rotation operation;
     display the indicator subjected to the rotation operation in superposition on the aberration pattern;
     determine the direction of aberration from the indicator that has been subjected to the rotation operation; and
     cause the aberration correction device to introduce an aberration in the direction of aberration based on determining the direction of aberration.

2. The electron microscope according to claim 1, wherein the control unit is further to:
   receive information on a type of aberration to be introduced, and
   wherein, when causing the display unit to display the indicator, the control unit is to:
   cause the display unit to display the indicator having a shape corresponding to the type of aberration based on the information on the type of aberration.

3. The electron microscope according to claim 1, wherein the aberration pattern is a Ronchigram.

4. The electron microscope according to claim 1, wherein the aberration pattern is a diffractogram tableau.

* * * * *